United States Patent [19]
de Groot

[11] Patent Number: 5,646,470
[45] Date of Patent: Jul. 8, 1997

[54] ACOUSTIC TRANSDUCER

[75] Inventor: Thomas J. de Groot, Fairhaven, Mass.

[73] Assignee: Benthos, Inc., North Falmouth, Mass.

[21] Appl. No.: 343,729

[22] Filed: Nov. 22, 1994

Related U.S. Application Data

[63] Continuation of Ser. No. 221,757, Apr. 1, 1994, abandoned.

[51] Int. Cl.$^6$ .................................................. H01L 41/08
[52] U.S. Cl. ........................ 310/337; 310/332; 367/157
[58] Field of Search .................................. 310/334–337, 310/800; 367/165, 173, 157

[56] References Cited

U.S. PATENT DOCUMENTS

| | | | |
|---|---|---|---|
| 3,582,692 | 6/1971 | Palini ................................... | 310/8.5 |
| 3,660,809 | 5/1972 | Pearson ........................... | 310/337 X |
| 3,749,948 | 7/1973 | Morris .................................. | 310/337 |
| 3,827,023 | 7/1974 | Henriquez et al. .................. | 310/345 |
| 3,832,762 | 9/1974 | Johnston et al. .................... | 29/25.35 |
| 3,868,954 | 3/1975 | Ueda .................................... | 128/2.05 |
| 3,893,342 | 7/1975 | Florian et al. ......................... | 73/517 |
| 3,970,878 | 7/1976 | Berglund ........................... | 310/337 X |
| 3,988,620 | 10/1976 | McDavid ............................... | 310/8.6 |
| 4,015,233 | 3/1977 | Laurent et al. ...................... | 367/165 |
| 4,048,526 | 9/1977 | Taylor .................................. | 310/329 |
| 4,051,395 | 9/1977 | Taylor .................................. | 310/329 |
| 4,163,206 | 7/1979 | Hall, Jr. ........................... | 367/173 X |
| 4,184,093 | 1/1980 | Sullivan ................................ | 310/331 |
| 4,344,010 | 8/1982 | Vig et al. .............................. | 310/361 |
| 4,536,862 | 8/1985 | Sullivan et al. ....................... | 367/153 |
| 4,649,525 | 3/1987 | Angona et al. ....................... | 367/31 |
| 4,679,178 | 7/1987 | Larsen et al. ....................... | 367/157 |
| 4,794,295 | 12/1988 | Penneck et al. ..................... | 310/330 |
| 4,833,659 | 5/1989 | Geil et al. ........................ | 367/165 X |
| 4,876,675 | 10/1989 | Ogura et al. ........................ | 367/155 |
| 4,996,675 | 2/1991 | Beauducel ........................... | 367/162 |
| 4,999,819 | 3/1991 | Newnham et al. .................. | 367/157 |
| 5,136,549 | 8/1992 | Berglund ............................. | 367/20 |
| 5,144,597 | 9/1992 | Lagier et al. ....................... | 367/166 |
| 5,276,657 | 1/1994 | Newnham et al. .................. | 367/157 |

OTHER PUBLICATIONS de Groot, Thomas, "Acoustic Transducer", Filed Apr. 1, 1994, U.S. Patent application, Serial No. 08/221,757, Assigned to Benthos, Inc.

Ricketts, Donald, "Model for a piezoelectric polymer flexural plate hydrophone", Raytheon Company, accepted for publication Jun. 28, 1981.

(List continued on next page.)

*Primary Examiner*—Mark O. Budd
*Attorney, Agent, or Firm*—Fish & Richardson, P.C.

[57] ABSTRACT

A transducer includes an elongated piezoelectric sensor having only a single integrated mass of piezoelectric material and a pair of relatively longer opposite edges and a pair of relatively narrower opposite edges. The transducer also includes a sensor support that imposes less constraint on one of the pairs of edges than on the other pair.

A transducer has two piezoelectric sensors, and a support for supporting the two sensors back-to-back. Each of the sensors being held on opposite edges by a pair of opposite ledges, while two other opposite edges of the sensors are less constrained. The maximum displacement of the two less constrained edges of each sensor are limited by another pair of opposite ledges which are spaced away from the sensor when the sensor is in its normal position.

A transducer has two piezoelectric sensors mounted back-to-back on a housing that includes a rib which supports an edge of each sensor. The rib has a hole that opens onto a surface of each of the sensors, and a mass of conductive material is formed in the hole to make electrical connection between the surfaces of the sensors.

A transducer includes an elongated chamber having at least one open end to allow fluid to flow into the chamber, and a piezoelectric sensor mounted inside the chamber. The sensor has faces defined by edges, and wicking material is inserted inside the chamber between the sensor and the chamber, for wicking fluid into the chamber.

17 Claims, 12 Drawing Sheets

OTHER PUBLICATIONS

"Depth Limited Model T-4 (40275)", Teledyne Exploration.
"Deep Tow Model T-2 (28402)", Teledyne Exploration, pp. 1-1 – 1-2.
"Teledyne Model T-2N Hydrophone", Teledyne Marine Products.

Thurston, Edward G., "The Theoretical Sensitivity of Three Types of Rectangular Bimorph Transducers", The Journal of Acoustical Society of America, vol. 25, No. 5, Sep. 1953, pp. 870–872.

Germano, Carmen P., "Flexure Mode Piezoelectric Transducers", IEEE Transactions on Audio and Electroacoustics, vol. AU–19, No. 1, Mar. 1971.

ACOUSTIC TRANSDUCER

This is a continuation of U.S. patent application Ser. No. 08/221,757, filed on Apr. 1, 1994 now abandoned, assigned to the same assignee as this application, and incorporated by reference.

BACKGROUND

This invention relates to acoustic transducers.

Transducers, are used, for example, to detect sound radiated or reflected from sources beneath or on top of the sea surface by converting sound energy into electrical energy. Transducers may be used in seismic streamer arrays. The resulting data may be used to identify the location of fossil fuels in the sea bed geologic layers. Transducers are also useful in naval towed arrays where acoustic data is processed to identify threat targets.

Transducers can also radiate acoustic sound energy by converting electrical energy received from a signal generator. For example, transducers may emit sound energy that can be used as a homing beacon.

A typical piezoelectric transducer has a thin circular piezoceramic disk attached to a slightly larger diameter conductive metal disk which is mounted over an air cavity. Such piezoelectric disk assemblies are in common use in audio assemblies for toys, alarms, computer, hi-fi speakers, and microphones.

High electrical capacitance, low impedance, low harmonic distortion, and good dynamic pressure sensitivity performance are often achieved by using large surface areas and/or large volumes for the piezoelectric material.

SUMMARY

In general, in one aspect, the invention features a transducer including an elongated piezoelectric sensor having only a single integrated mass of piezoelectric material and a pair of relatively longer opposite edges and a pair of relatively narrower opposite edges. The transducer also includes a sensor support that imposes less constraint on one of the pairs of edges than on the other pair.

Embodiments of the invention may include the following features. The support may impose less constraint on the pair of narrower edges. The support may leave the one pair of edges unconstrained. The support may have a pair of opposite ledges which support the edges of one of the pairs, and the sensor may be rectangular and the ledges may support the two relatively longer opposite edges of the sensor. A second sensor may also be held on the sensor support, and the second sensor may have only a single integrated mass of piezoelectric material and a pair of relatively longer opposite edges and a pair of relatively narrower opposite edges; the sensor support imposing less constraint on one of the pairs of edges of the second sensor than on the other pair of edges of the second sensor. The sensor support may include a restraint which limits the maximum displacement of the less constrained pair of edges of the sensor. The restraint may be a pair of opposite ledges which are spaced away from the less constrained pair of edges when the sensor is in its normal position. The sensor support may also have a web positioned to limit the maximum displacement of a central portion of the sensor.

In general, in one aspect, the invention features a transducer having two piezoelectric sensors, and a support for supporting the two sensors back-to-back. Each of the sensors being held on opposite edges by a pair of opposite ledges, while two other opposite edges of the sensors are less constrained. The maximum displacement of the two less constrained edges of each sensor are limited by another pair of opposite ledges which are spaced away from the sensor when the sensor is in its normal position.

Embodiments of the invention may include the following features. Each of the two sensors may be rectangular, and the two pairs of ledges for each sensor may be arranged in a rectangle.

In general, in one aspect, the invention features a method for mounting a rectangular piezoelectric sensor having two long edges and two narrower edges on a support having a rectangular aperture and two ledges arranged along two longer sides of the aperture. Adhesive is provided along each of the two longer edges of the sensor, between one face of the sensor and the ledges, and adhesive is provided along each of the two narrower edges of the sensor at either the interface between the other face of the sensor and the wall of the rectangular aperture or along each of the two narrower edges of the sensor, between one face of the sensor and the ledges.

In general, in one aspect, the invention features a transducer having two piezoelectric sensors mounted back-to-back on a housing that includes a rib which supports an edge of each sensor. The rib has a hole that opens onto a surface of each of the sensors, and a mass of conductive material is formed in the hole to make electrical connection between the surfaces of the sensors.

Embodiments of the invention may include the following features. The conductive material may be a flexible conductive adhesive or solder.

In general, in one aspect, the invention features a transducer including an elongated chamber having at least one open end to allow fluid to flow into the chamber, and a piezoelectric sensor mounted inside the chamber. The sensor has faces defined by edges, and wicking material is inserted inside the chamber between the sensor and the chamber, for wicking fluid into the chamber.

Embodiments of the invention may include the following features. At least a substantial portion of one of the faces of the sensor may be unobstructed by the wicking material. The wicking material may be in the form of a web wrapped around the edges of the sensor, and the wicking material may provide filtering of noise from vibrations occurring in the fluid.

In general, in one aspect, the invention features a transducer having a piezoelectric sensor mounted on a support that is held in a housing. An electrical lead is attached at one end to the face of the sensor, wrapped around an opposite end of the support for strain relief, and has a free end outside the housing for connection to circuitry.

Embodiments of the invention may include the following features. Foam material may be positioned on the two opposite ends of the support, the electrical lead being wrapped around an end of the support and the foam material.

In general, in one aspect, the invention features a transducer including an elongated chamber having at least one open end to allow the passage of fluid into the chamber, and a piezoelectric sensor mounted inside the chamber. A flexible cover material is positioned around the chamber and over a portion of the open end to hold the sensor within the chamber.

Embodiments of the invention may include the following features. The cover material may be heat shrink material or an elastic sleeve.

In general, in one aspect, the invention features a transducer including a piezoelectric sensor, and a depth limiting mechanism for electrically disabling the piezoelectric sensor below a predetermined depth.

Embodiments of the invention may include the following features. The sensor may be completely disabled below the predetermined depth. The disabling may be achieved by electrical shorting. After the depth limiting mechanism disables the sensor below the predetermined depth, the depth limiting mechanism may permit the sensor to resume operating when the sensor is brought above the predetermined depth.

In general, in one aspect, the invention features a transducer having a first piezoelectric sensor, a second piezoelectric sensor, and a depth limiting mechanism electrically coupled to the sensors for preventing operation of the transducer below a predetermined depth.

Embodiments of the invention may include the following features. The sensor may be completely disabled below the predetermined depth. After the depth limiting mechanism disables the sensors below the predetermined depth, the depth limiting mechanism may permit the sensors to resume operating when the sensors are brought above the predetermined depth. The depth limiting mechanism may be mounted to the first sensor and electrically connected to a lead of the second sensor and may electrically short the two sensors together below a predetermined depth. The depth limiting mechanism may be electrically connected to a lead of the first sensor and a lead of the second sensor and may electrically short the two leads together below a predetermined depth. The depth limiting mechanism may include a diaphragm that collapses against the first sensor below the predetermined depth. The diaphragm may be mounted to the first sensor with an adhesive ring. The depth limiting mechanism may include two diaphragms that collapse against each other below the predetermined depth. Each diaphragm may be mounted to a side of an adhesive ring.

In general, in one aspect, the invention features a transducer having an elongated ceramic piezoelectric sensor, having only a single integrated mass of piezoelectric material, and a support on which the sensor is mounted.

Embodiments of the invention may include the following features. The sensor face may be generally rectangular with two straight sides and two straight ends or two curved ends. A second elongated ceramic piezoelectric may be mounted on the support with a face of the first sensor facing away from the face of the second sensor and with the second sensor being separated from the first sensor. Or a second elongated ceramic piezoelectric sensor may be mounted on the support with the two sensors arranged end to end. A third elongated ceramic piezoelectric sensor may also be mounted on the support in an end to end arrangement with the first sensor, and a fourth elongated ceramic piezoelectric sensor may be mounted on the support in an end to end arrangement with the second sensor and back to back with the third sensor. Sensors facing away from each other may have the same polarity or opposite polarity. The support may be mounted in a tube having ends which are open to passage of fluid. A mounting mechanism may hold the support in the tube without obstructing passage of fluid into the tube. Material that is permeable by fluid may be interposed between the tube and the support. The support may include a recess over which the sensor is mounted to permit the sensor to vibrate freely.

In general, in another aspect, the invention features a transducer having two piezoelectric sensors and a single support on which both of the two sensors are mounted in an end to end arrangement.

Embodiments of the invention may include the following features. The two sensors may have elongated faces. The support may include two recesses over which the sensors are mounted to permit the sensors to vibrate freely. Two other piezoelectric sensors may also be mounted on the support in an end to end arrangement, with one sensor of each end to end pair lying back to back with one sensor of the other end to end pair, and all four sensors may have two faces of opposite polarity with the sensors lying back to back having faces of similar or opposite polarity facing each other. The sensors of each end to end pair of sensors may be electrically connected in series and the two pairs may be electrically connected in parallel. A separating layer may be disposed between the sensors that are lying back to back.

In general, in another aspect, the invention features a transducer having two pairs of sensors, the sensors of each pair being electrically connected in series, the two series-connected pairs being connected in parallel.

In general, in another aspect, the invention features a transducer having a piezoelectric sensor, an elongated chamber having at least one open end to allow the passage of fluid into the chamber, and a mechanism for securing the sensor within the chamber without applying pressure between the inner wall of the chamber and the sensor.

Embodiments of the invention may include the following features. The securing mechanism may be a pin or a sleeve that extends around a first portion of the ends of the chamber, leaving a second portion of the ends of the chamber open to allow the passage of fluid into the chamber. The sensor may be mounted with its face parallel to the longitudinal axis of the chamber and the chamber may be a tube open at both ends.

Among the advantages of the invention are the following. The transducer has a small outside diameter while achieving the electroacoustic characteristics (high sensitivity, low harmonic distortion, and low electrical impedance) of much larger transducers, as well as facilitating an omni-directional beam pattern. When towed in arrays, the reduced diameter profile of the transducers lessens drag forces on the towing vessel, which permits more arrays to be towed, and hence more data to be gathered, without impacting the power requirements of the towing vessel. At the same time, due to the reduced dimensions of the transducer, these longer arrays may be stored on the same deck reels that are used to store the larger type transducers. The transducer is protected and electrically insulated from dust, moisture, fluid, and hydrocarbon solvents. Electrical charges created by spurious mechanical acceleration and vibration are cancelled when the displacement of the plates are out of phase. The mounting scheme assures good contact between the fluid and the sensor while screening out vibration and other noise. Under excessive pressure, the paired sensors collapse upon each other (i.e., by bending inward) or bend inward and make contact with the separating layer or end ledges and web. Upon release from pressure, the sensors rebound to their original position without damage.

Other advantages and features will become apparent from the following description and from the claims.

DESCRIPTION

FIGS. 1, 2, and 3 are perspective views, and a cut-away perspective view, of a transducer.

Figure 8:
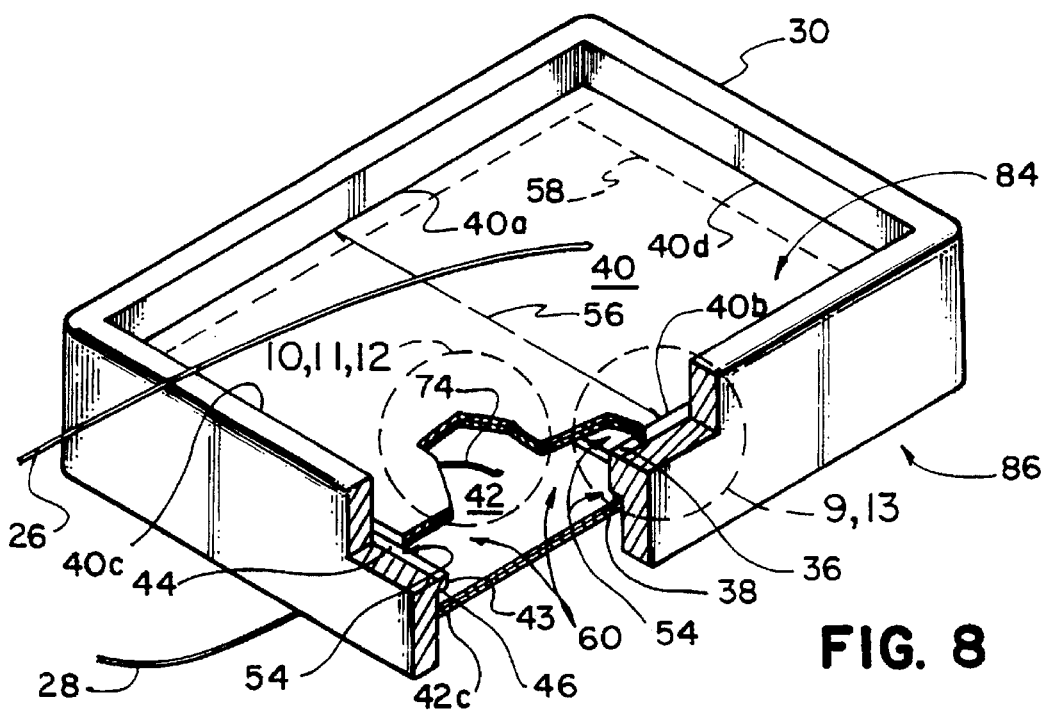
FIG. 8 is a perspective cut-away view of a housing assembly and sensor assemblies.

FIGS. 9, 10, 11, 12, and 13 are enlarged perspective views of portions of the structure of FIG. 8.

Figure 14:
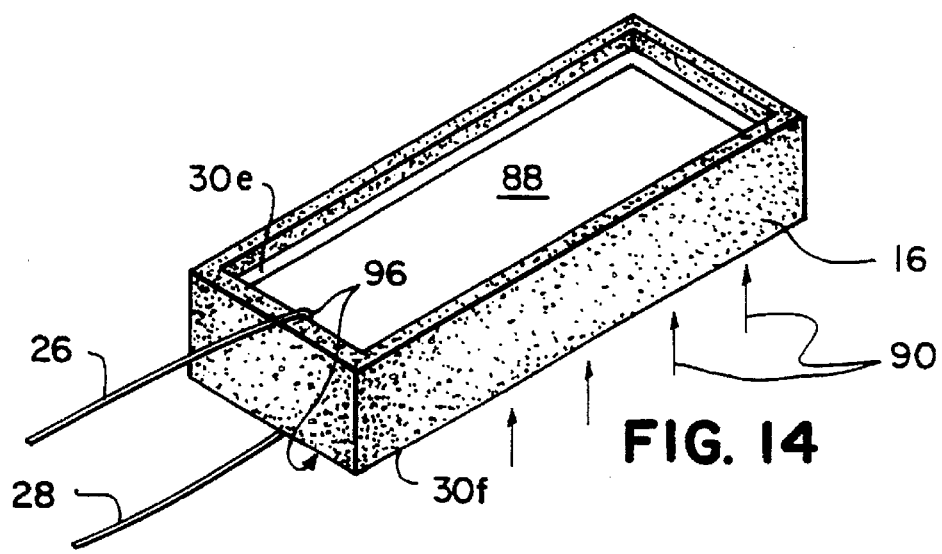
Figure 15:
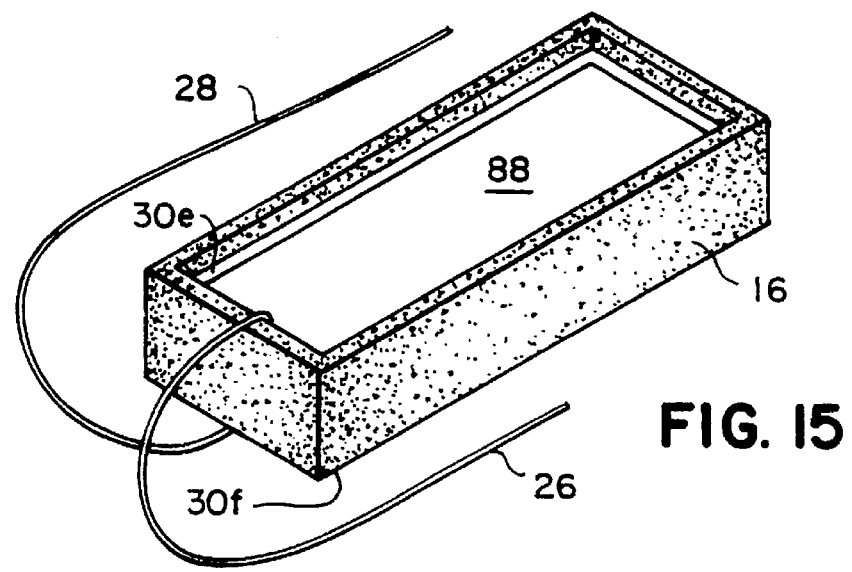
Figure 16:
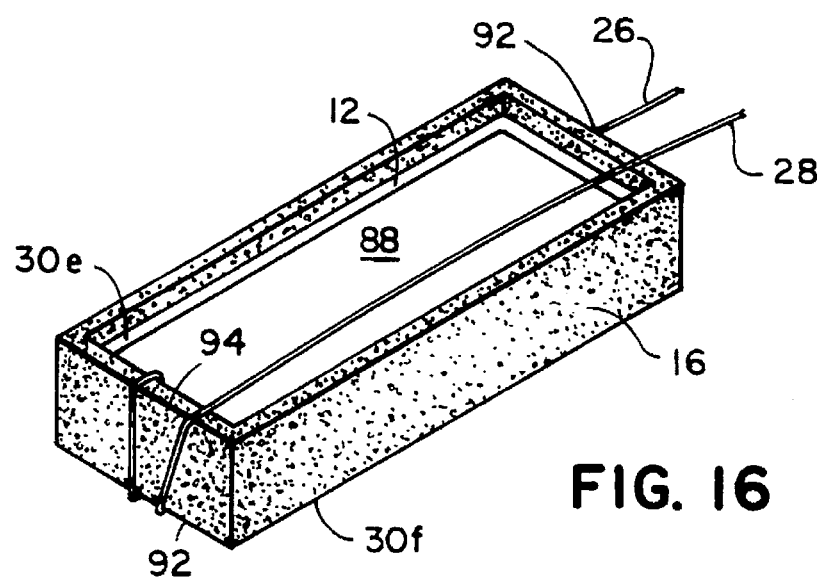

FIGS. 14, 15, and 16 are perspective views of a sensor assembly wrapped in foam material and electrical leads.

Figure 17:
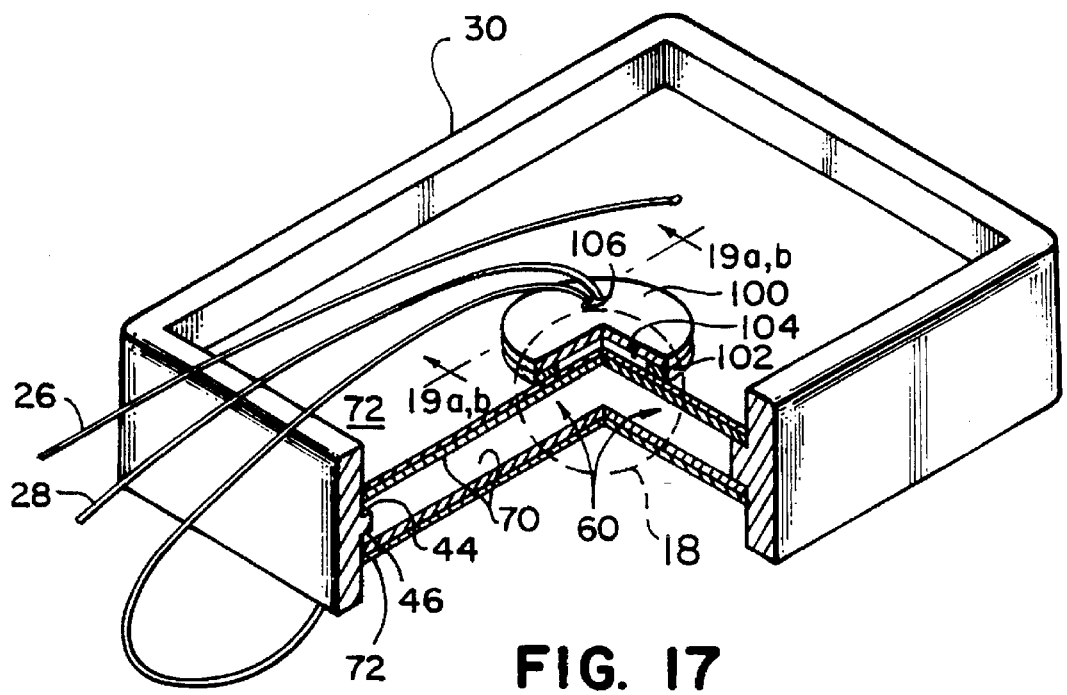

FIG. 17 is a perspective cut-away view of a housing assembly, sensor assemblies, and a depth limiting mechanism.

Figure 18:
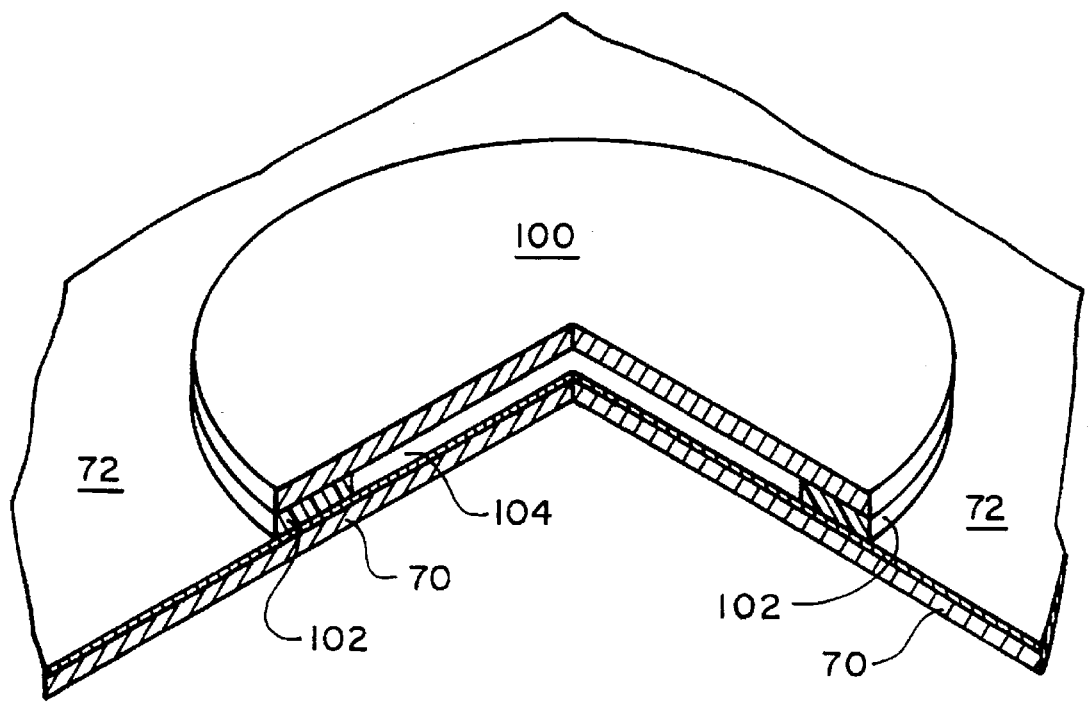
Figure 19A:
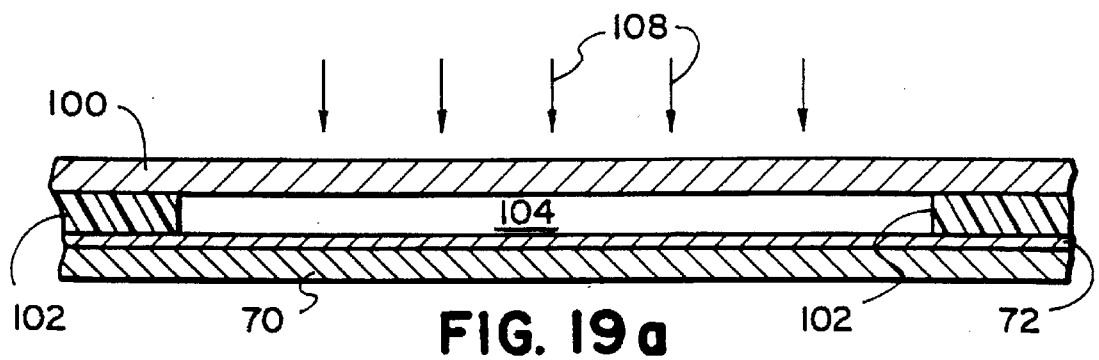
Figure 19B:
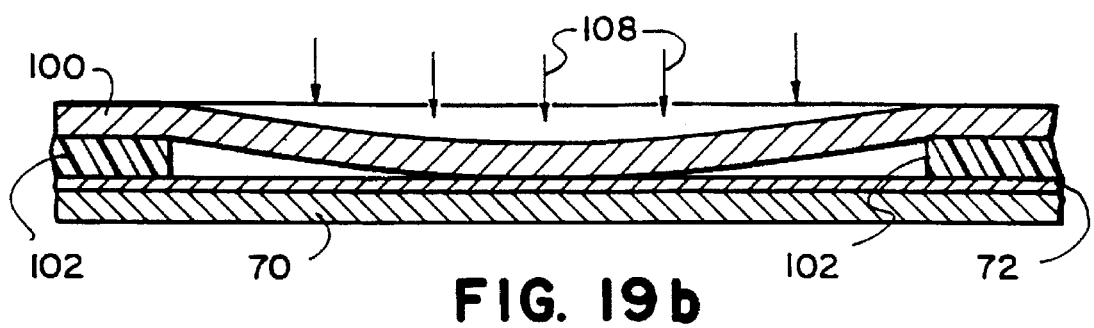

FIGS. 18, 19a, and 19b are enlarged perspective views of portions of the depth limiting mechanism of FIG. 17.

Figure 20:
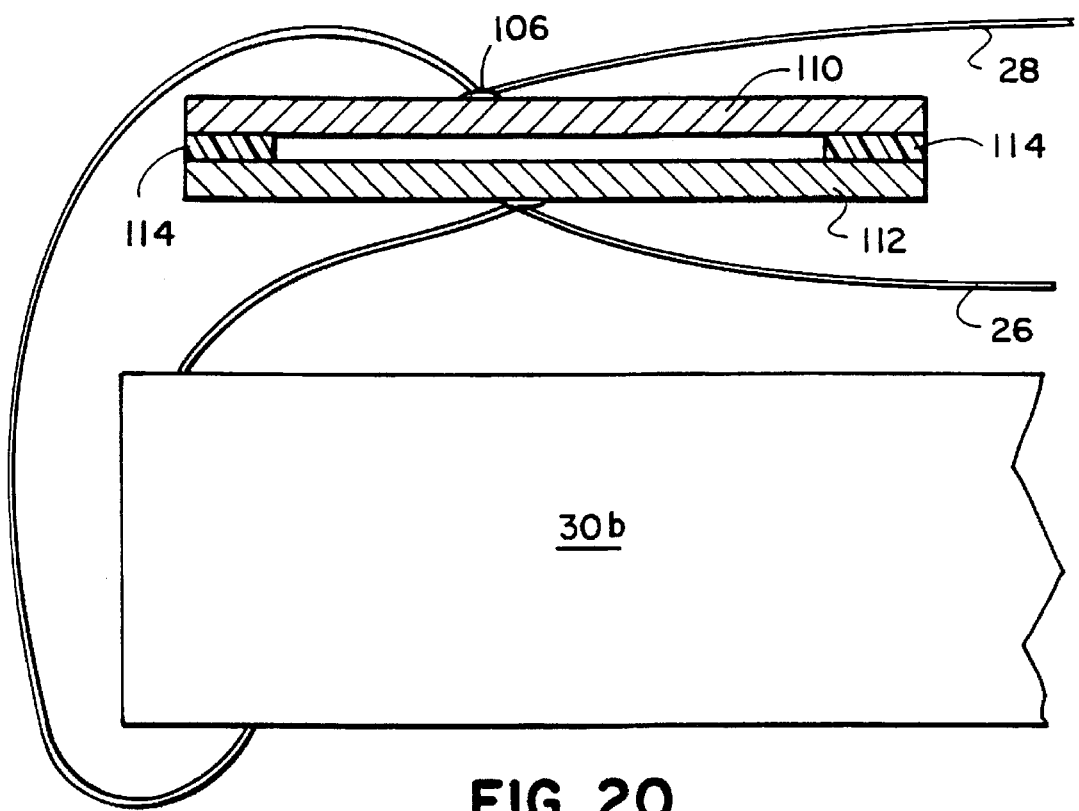

FIG. 20 is a plan of a housing assembly and a depth limiting mechanism.

Figure 21:
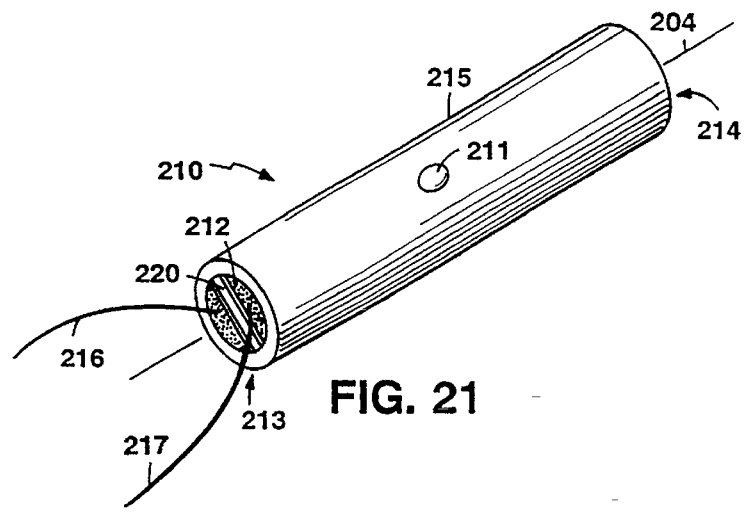

FIG. 21 is a perspective view of a transducer.

Figure 22:
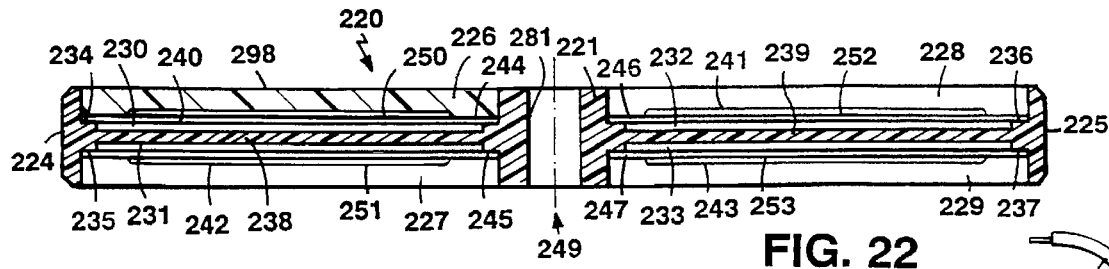

FIG. 22 is a sectional side view of a housing assembly.

Figure 23:
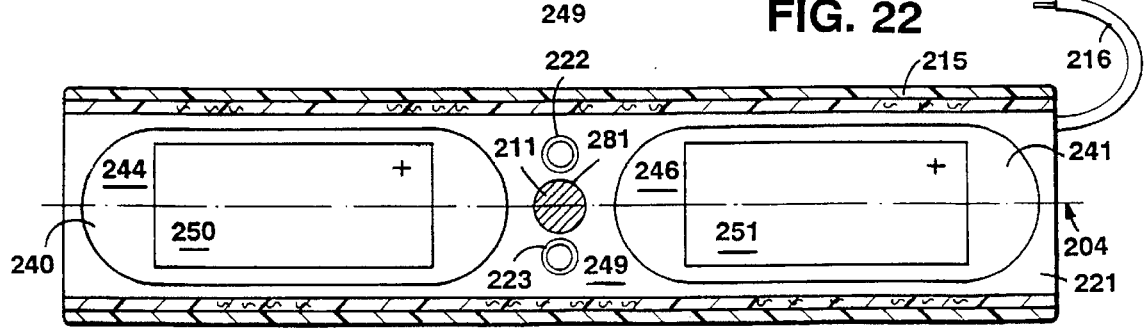

FIG. 23 is a sectional top view of the transducer.

Figure 24:
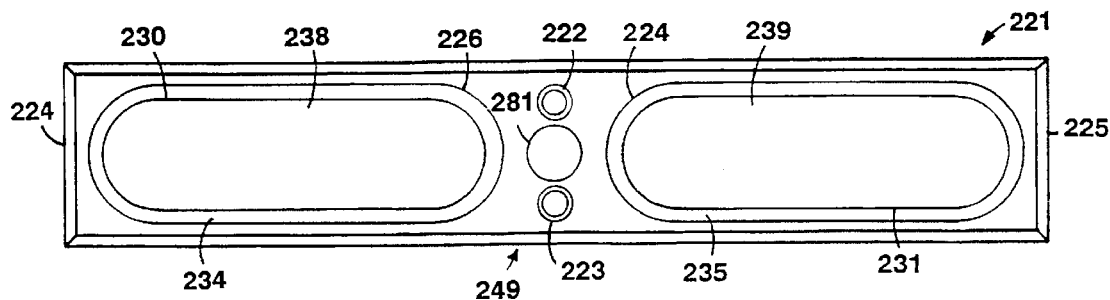

FIG. 24 is a top view of the housing.

Figure 25:
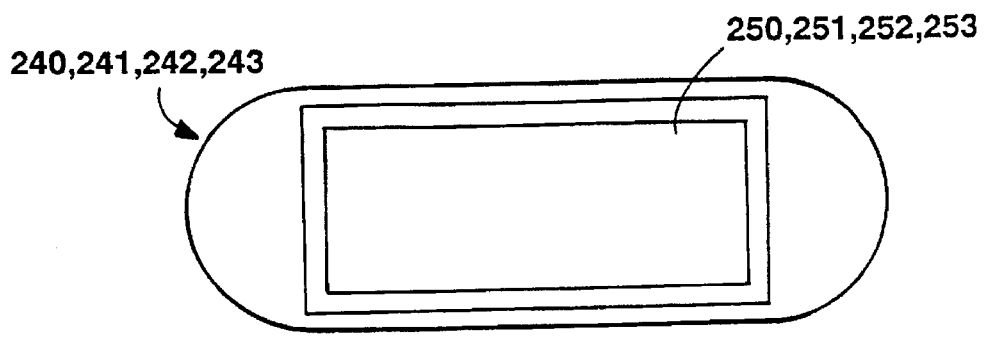

FIG. 25 is a top view of a sensor assembly.

Figure 26:
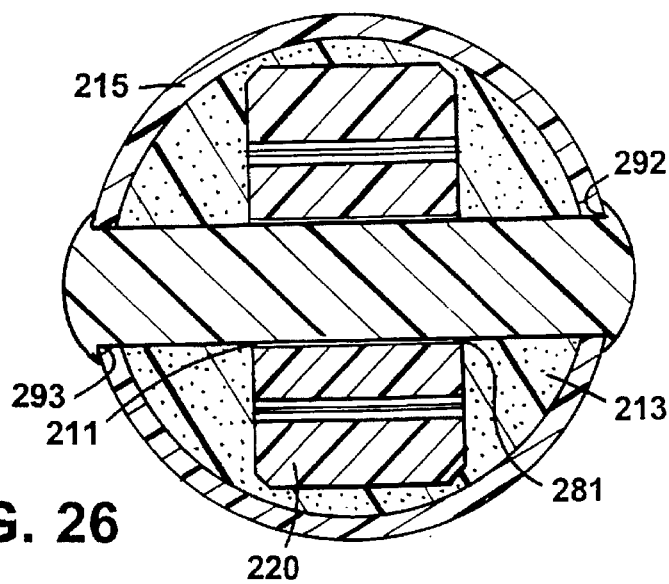

FIG. 26 is an end view of the transducer.

Figure 27:
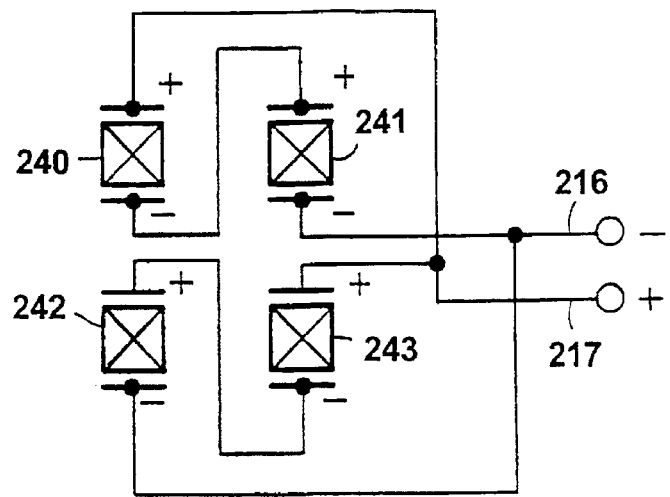

FIG. 27 is a wiring diagram.

Referring to FIGS. 1–4, an acoustic transducer 10 includes a rectangular housing assembly 12 inside a tube 14. A piece of foam material 16 is wrapped around the sides of housing assembly 12 (FIG. 15) such that foam 16 is between sides 12a and 12b and the inside of tube 14. Foam 16 centers housing assembly 12, along a longitudinal axis 18, within tube 14. Housing assembly 12 and foam 16 are held inside tube 14 by a cover material 20 that surrounds the external surface of tube 18 and covers portions of the ends 22, 24 of tube 18. Cover material 20 leaves other portions 97 of the ends 22, 24 open to allow fluid to enter tube 14. Insulated wires 26, 28 of housing assembly 12 extend through open end 22 and can be connected to a charge amplifier, a voltage amplifier, a transformer coupled device, or any current sensing device (not shown).

Figure 5:
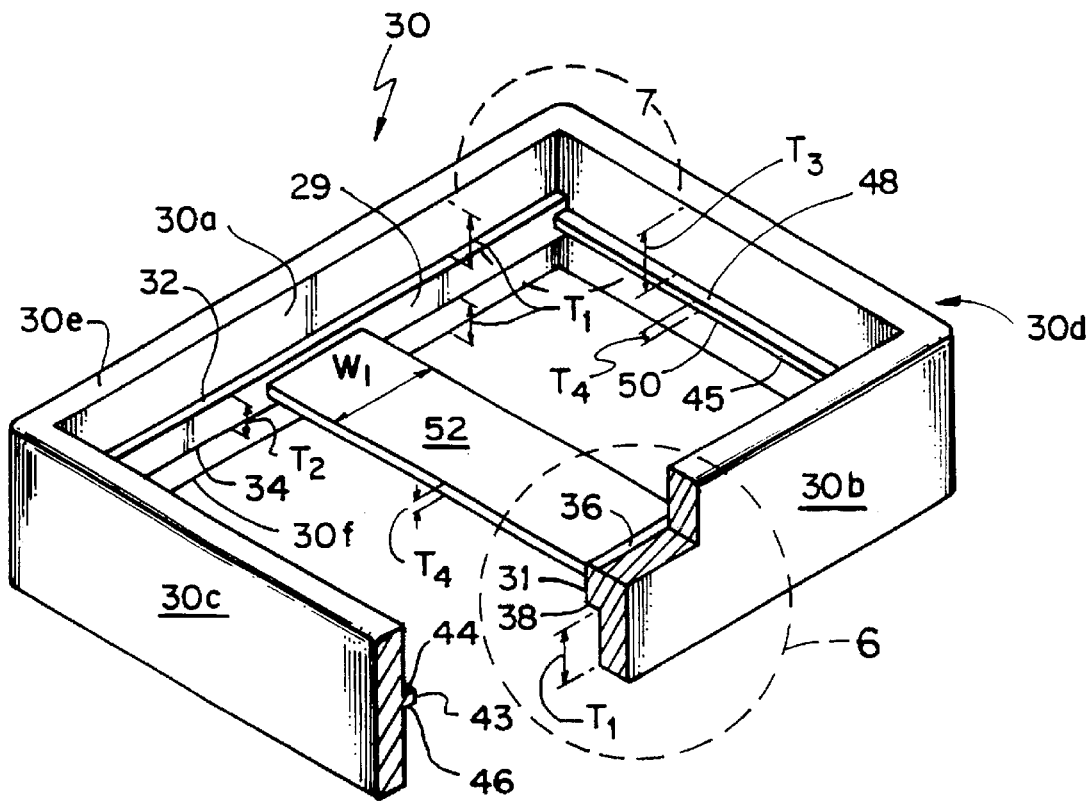
FIG. 5 is a perspective cut-away view of a housing assembly.
Figure 6:
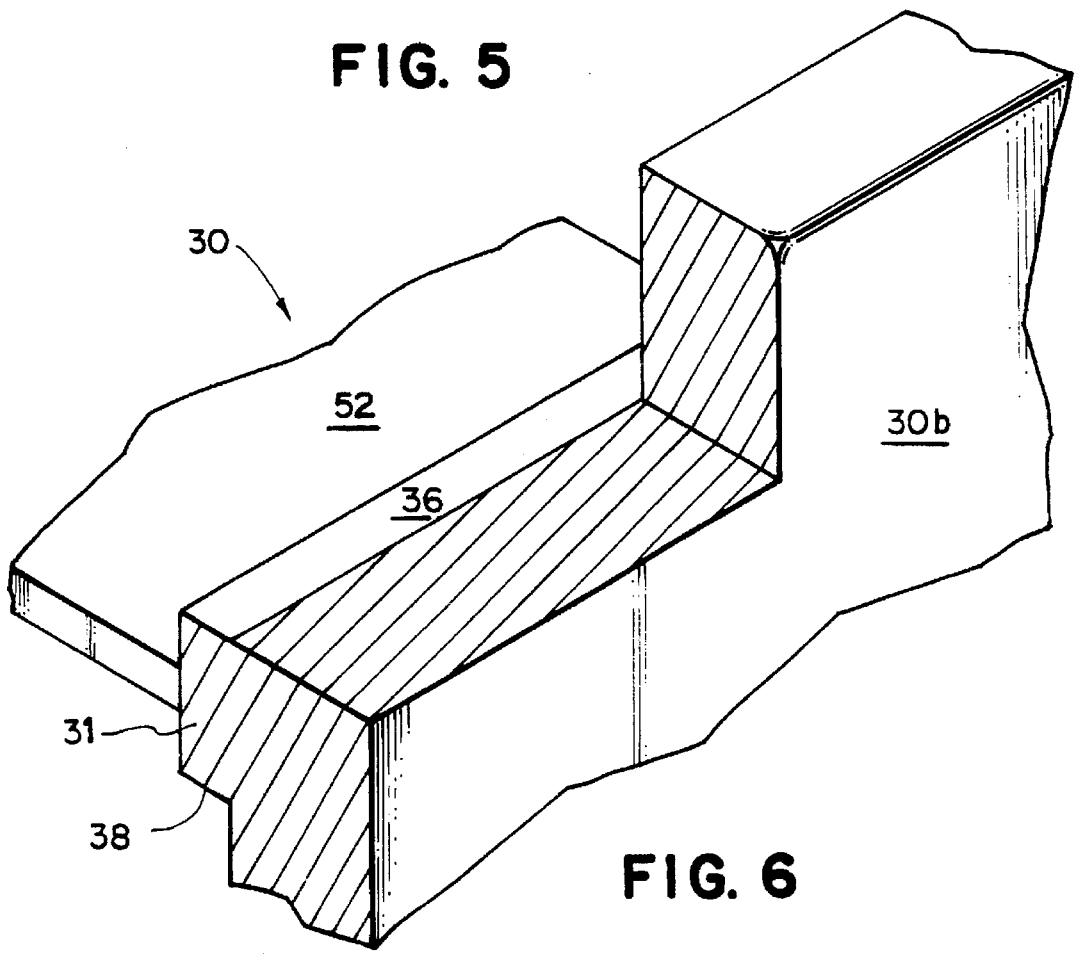
FIGS. 6 and 7 are enlarged perspective views of portions of the structure of FIG. 5.
Figure 7:
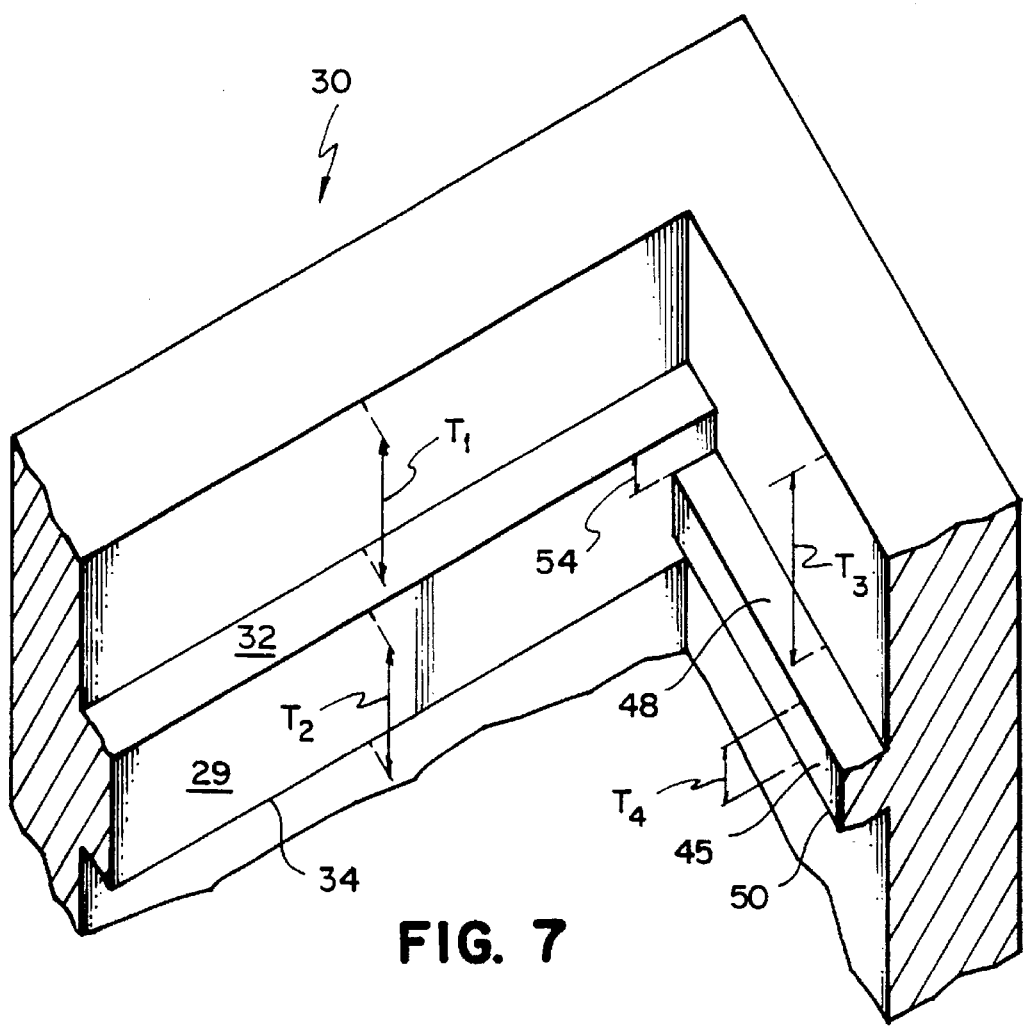

Referring to FIGS. 5–7, housing assembly 12 includes a generally rectangular housing body 30 of molded polyetherimide (containing about 30% glass), 1.6 inches long, 0.5 inches wide, and 0.25 inches thick, with radiused or chamfered edges. Housing body 30 includes two side ribs 29 and 31 that extend along the inside lengths of sides 30a and 30b of housing body 30. Each side rib 29, 31 has a top surface 32, 36 and a bottom surface 34, 38, respectively, which will be referred to as the side ledges. The side inches) from top 30e and bottom 30f of housing body 30, and side ribs 29, 31 are approximately 0.07 inches thick ($T_2$). Thus, the top and bottom surfaces of the side ledges lie in the same plane.

Figure 9:
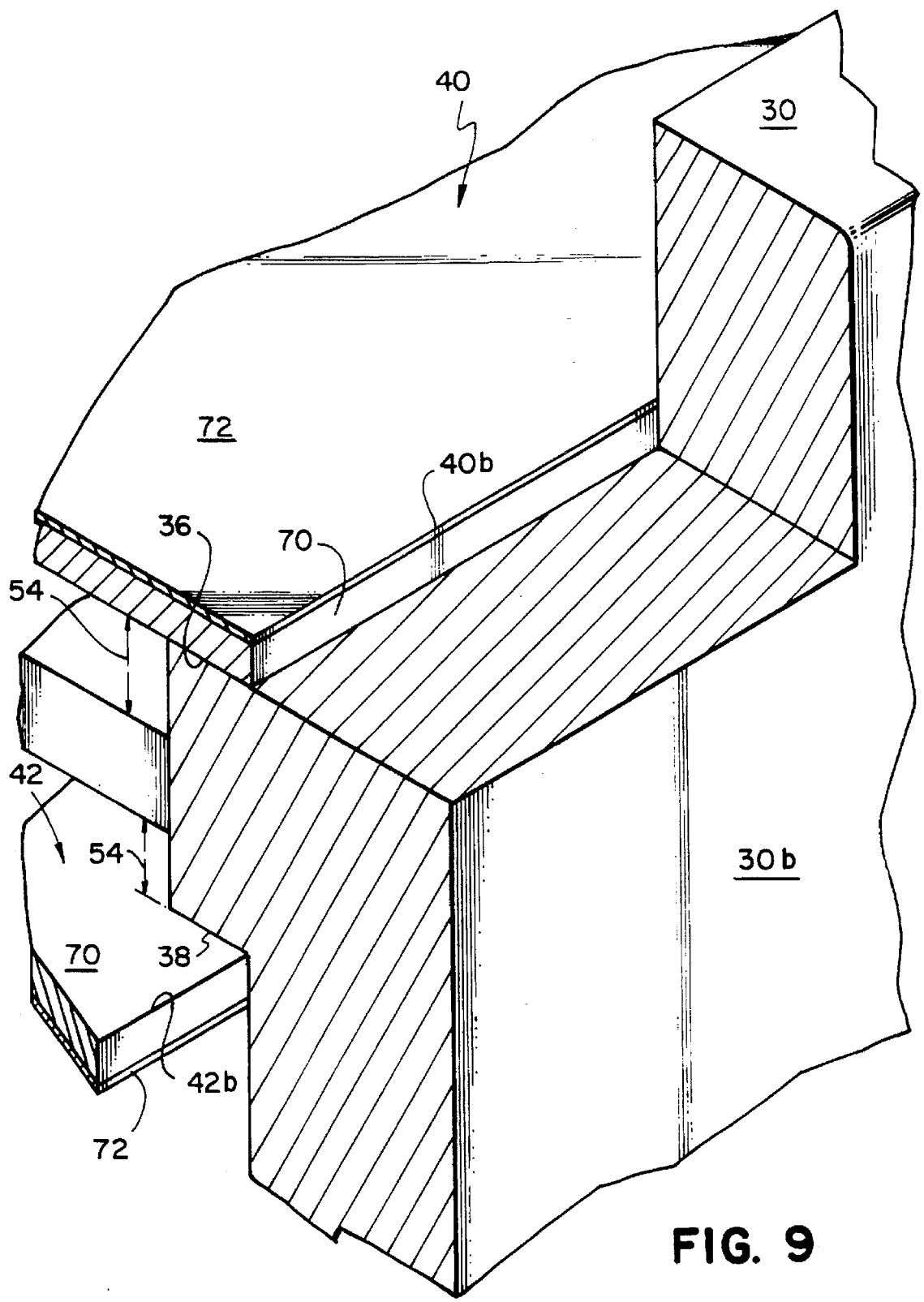
Figure 10:
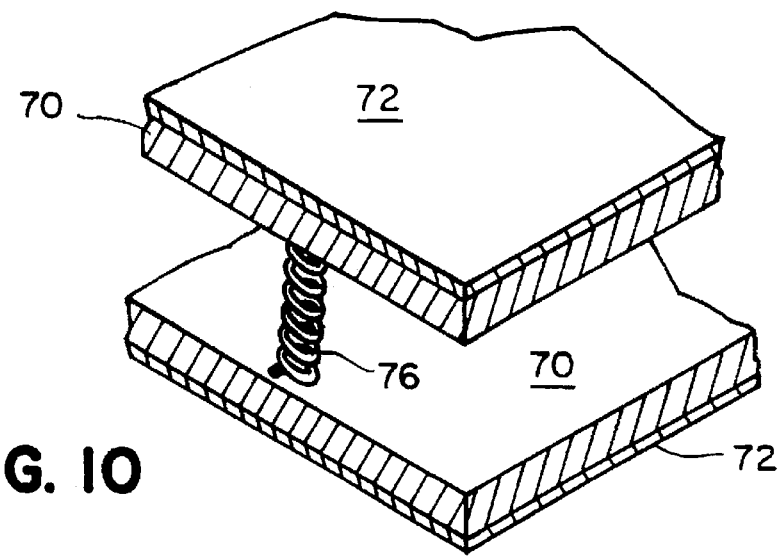

As shown in FIGS. 8 and 9, side ledges 32 (not shown) and 36 support the long sides 40a and 40b of sensor assembly 40, and side ledges 34 (not shown) and 38 support the long sides 42a (not shown) and 42b of sensor assembly 42. A flexible silicone adhesive (not shown) may be applied to the side ledges to hold sensor assemblies 40, 42 to the ledges. Other mounting methods, such as soldering or ultrasonic welding, may also be used.

Housing body 30 also has end ribs 43, 45 that extend along the inside widths of narrow ends 30c and 30d of housing body 30 (FIGS. 5 and 7). Each end rib 43, 45 has a top surface 44, 48 and a bottom surface 46, 50, respectively, which will be referred to as the end ledges. The end ledges are recessed by a distance of $T_3$ (approximately 0.105 inches) from top 30e and bottom 30f, respectively, of housing body 30, and end ribs 43, 45 are approximately 0.04 inches thick ($T_4$). Housing body 30 also has a web 52 that extends between sides 30a and 30b. Web 52 is approximately 0.325 inches wide ($W_1$) and 0.04 inches thick ($T_4$), and like the end ledges, web 52 is recessed by a distance of $T_3$ from top 30e and bottom 30f of housing body 30. Thus, the top and bottom surfaces of web 52 lie in the same plane as the top and bottom end ledges.

The narrow ends 40c, 40d, 42c, and 42d (not shown), referred to as the sensor assembly ends, of sensor assemblies 40, 42 do not rest upon the surfaces of web 52 and the surfaces of the end ledges, because the planes of the surfaces of the end ledges and web 52 are further recessed (i.e., $T_3 > T_1$) than are the planes of the surfaces of the side ledges. As a result, free space 54 (FIGS. 8 and 9) between sensor assemblies 40 and 42 and the surfaces of the end ledges and web 52 allow the portion 56 (FIG. 8) of the sensor assemblies that is between the side ledges to flex and vibrate freely.

As a result, the sensor assemblies have an increased sensitivity; they are responsive to a lower operating pressure. The increase in sensitivity permits the assembly discussed to replace larger sensor assemblies of comparable sensitivity; a lower length to width ratio, for example, four to one, will provide comparable sensitivity to larger sensor assemblies having, for example, a length to width ratio greater than five to one. As an example, a sensitivity of approximately 2 Hz to 2 kHz +/–0.5 db can be achieved.

Web 52 and the end ledges provide mechanical isolation between the sensor assemblies 40, 42, and prevent over displacement (i.e., bending to the point of cracking) of the sensor assemblies. The sensor assemblies cannot flex beyond web 52 and the end ledges which prevents over displacement.

A flexible silicone adhesive can be applied either in free space 54 between the end ledges and the sensor assembly ends (adhesive not shown) or along portion 58 (FIG. 8) of a top side of the sensor assembly ends to seal the cavity 60 between the two sensor assemblies from moisture and contaminants. The flexibility of the silicone adhesive will still permit the ends of the sensor assemblies to flex and freely vibrate. Other mounting methods, such as soldering or ultrasonic welding, may also be used.

Referring to FIG. 9, each sensor assembly includes a copper alloy plate 70, for example, beryllium copper. The plates may also be made from other metals, plastics, or composite materials. A 0.009 inch+/–0.0015 inch thick piezoelectric sensor 72 (made of PZT-5H ceramic and available from the Vernitron Division of Morgan Matroc Inc.) is mounted on copper plate 70. The sensors may also be made from any other films or layers that will produce a charge when stress is applied to them or that will produce a displacement when an electrical field is applied. Such layers may include polyvinylidene fluoride (PVDF), PVDF copolymers, quartz, or rubber ceramic composites. Each sensor is polarized with one face being deemed positive, the other negative. With one sensor being mounted with its positive face exposed and the other sensor being mounted with its negative face exposed, each sensor is glued to its corresponding copper plate 70 using speed bonder 325 and activator 707 available from Loctite. Depending upon how the sensors are electrically connected, the sensors may also be glued with both their negative faces exposed, or both their positive faces exposed.

Referring to FIG. 8, when the sensors are mounted with one positive face exposed and one negative face exposed, the sensor assemblies may be electrically connected in series through a bus wire 74 that is soldered to each copper plate 70. Soldering bus wire 74 to each copper plate 70 requires assembly time, which increases the cost of manufacturing the sensor assemblies. Additionally, during assembly, bus wire 74 can become jammed in between one of the side ledges and the sensor assembly. Moreover, soldering bus wire 74 to each copper plate 70 can depolarize piezoceramic layer 72. The curie temperature (i.e., temperature at which a material loses polarization) of the piezoelectric material is approximately 300° C. Soldering typically requires a temperature above 300° C. (i.e., between 350° and 600° C.).

Figure 11:
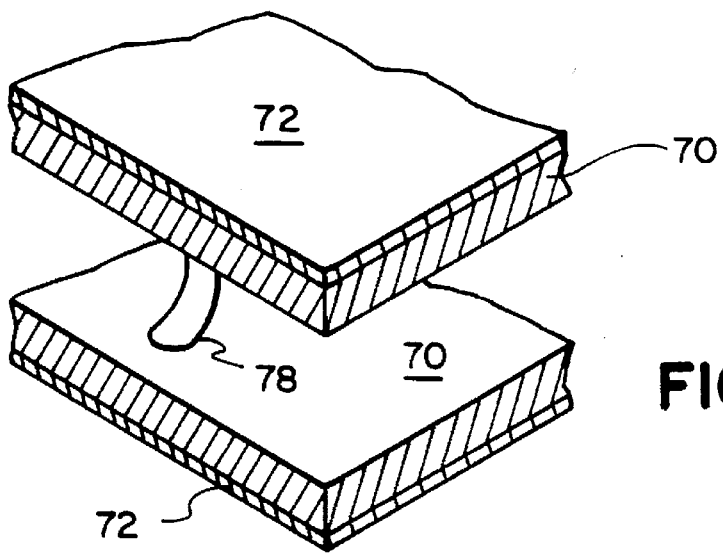
Figure 12:
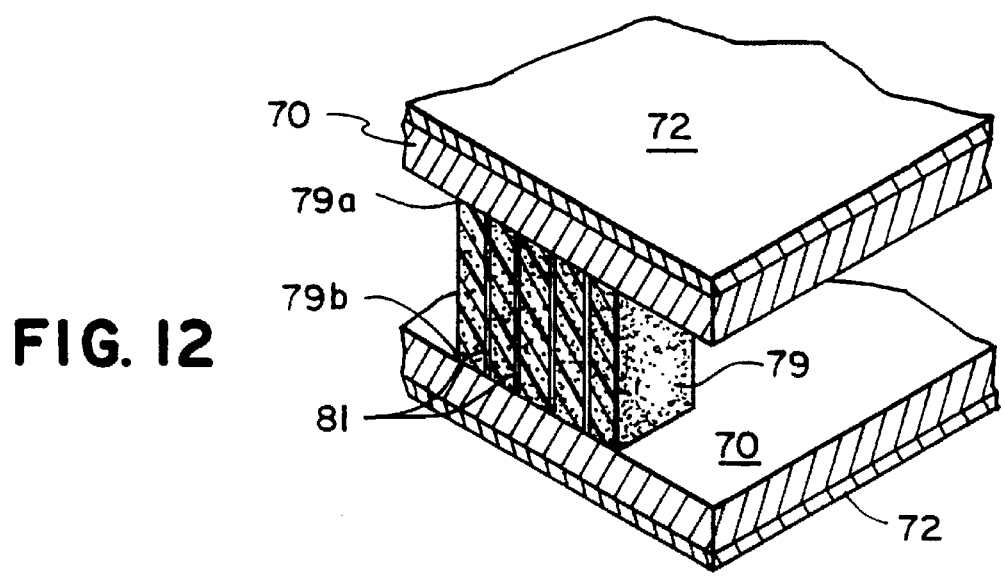

As an alternative to bus wire 74, a conductive spring 76 (FIG. 10) can be placed between the sensor assemblies. The force required to compress the spring may hold the spring in a fixed position between copper plates 70 and eliminate the need to solder the spring to copper plates 70. Another alternative is to electrically connect the two sensor assemblies through a flexible conductive adhesive 78 (FIG. 11). Another alternative, shown in FIG. 12, is to electrically connect the two sensor assemblies through a closed cell foam 79 having embedded conductive wires 81 (i.e., conductive foam) that extend from a top surface 79a to a bottom surface 79b of conductive foam 79. The force required to compress foam 79 may hold the foam in a fixed position between copper plates 70 or the foam may have conductive adhesive dispersed on surfaces 79a, 79b for attaching foam 79 to copper plates 70. In either case, the need to solder the electrical connection(s) between the copper plates is eliminated.

Web 52 and end ledges 44, 46, 48, and 50 can be configured to provide a cavity 58 to hold the conductive adhesive or the spring in a fixed position between copper plates 70.

Figure 13:
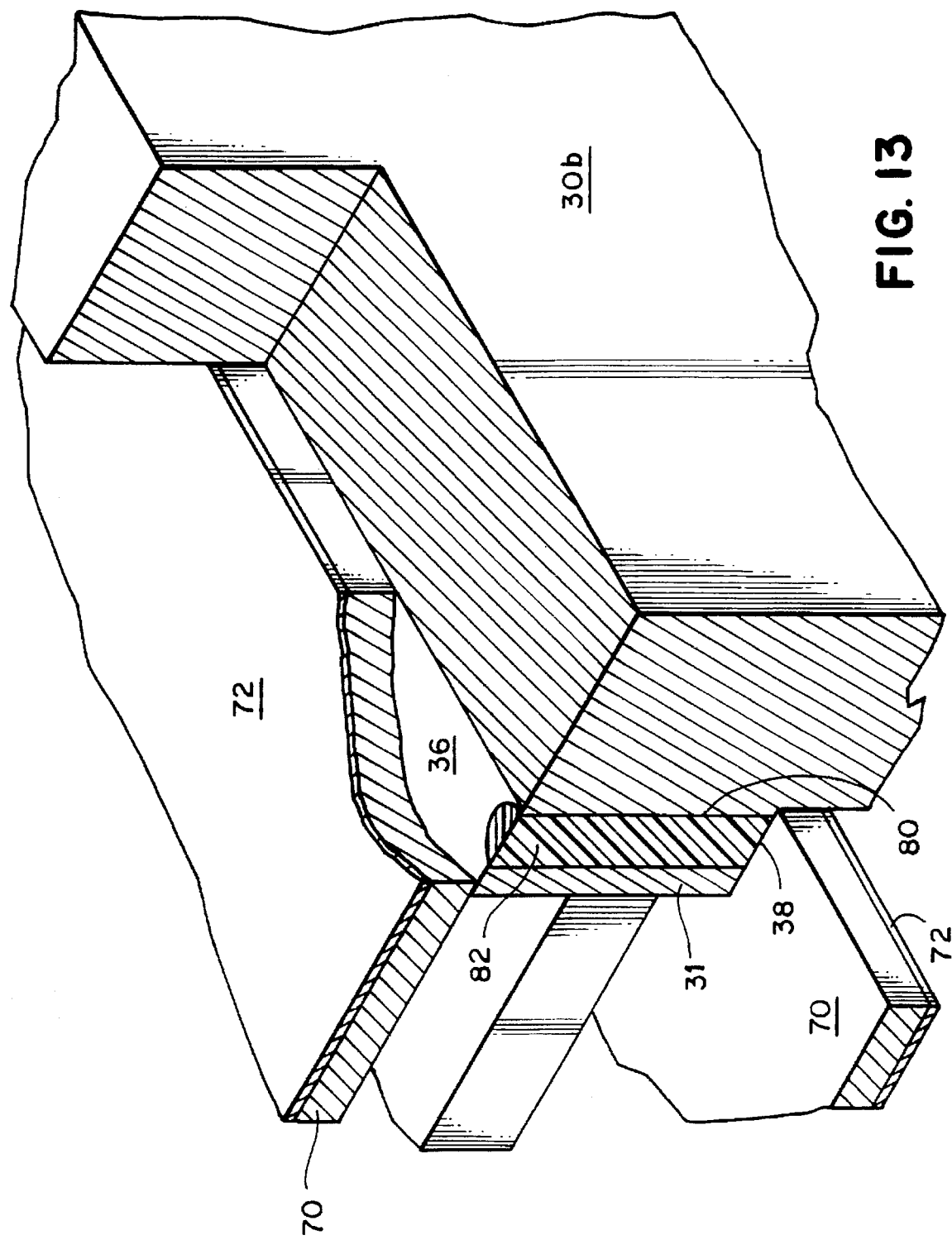

Referring to FIG. 13, another alternative to using bus wire 74 is to provide an electrical connection between copper plates 70 through a hole 80 (only half the hole 80 is shown) in a side rib 30 (or 29, not shown) of housing body 30. A wire (not shown) can be fed through hole 80 or hole 80 can be filled with conductive material 82, such as a silver filled epoxy or silicone. The molding of housing body 30 may provide hole 80, or hole 80 may be drilled after housing body 30 is molded. Hole 80 may be located anywhere along the side ribs. Conductive material 82 may also be solder, or a non-curing conductive paste or gel.

As previously discussed, the side ledges constrain the vibrations of the sensor assemblies. By locating the conductive material in a hole through two side ledges (i.e., a side rib), a reliable electrical connection is established; flexing of the sensor assembly will not degrade the integrity of the electrical connection.

Assembly is made easier by allowing the sensor assemblies to be placed into housing body 30, respectively, from top 30e and bottom 30f. Easier assembly reduces assembly time and manufacturing cost. The cost of manufacturing is further reduced because the conductive material 82 is less expensive than bus wire 74. Moreover, the piezoceramic material is not depolarized by soldering during assembly.

After copper plates 70 are adhered within housing body 30, each resulting basin 84, 86 (FIG. 8) is filled with a polyurethane or epoxy seal 88 (FIG. 14, only one is shown). The seal protects and electrically insulates the sensor from dust, moisture, fluid, and hydrocarbon solvents.

A rectangular piece 16 (FIG. 4) of open cell soft foam (made of polyether-based polyurethane) is then wrapped around the sides 30a, 30b, 30c, and 30d of housing body 30, as shown in FIG. 14. Foam 16 could be glued to the sides of the housing body or multiple pieces could be glued to the sides of the housing body.

Piezoceramic sensors 72 flex in response to acoustical vibrations. This flexing causes sensors 72 to produce a voltage across leads 26, 28. By mounting the sensors 72 back-to back (i.e., the planes in which the sensors lie are parallel), spurious mechanical accelerations and vibrations are cancelled when the displacements of the paired sensors are out of phase. The spurious acceleration induced charges are completely cancelled when the paired sensors are 180° out of phase.

Instead of wrapping foam 16 around sides 30a, 30b, 30c, and 30d, foam 16 can be wrapped around sides 30c and 30d, top 30e, and bottom 30f (not shown). This assembly, however, may prevent complete acceleration cancellation. As the boat or pulling vessel accelerates, the pressure on the top 30e or bottom 30f of transducer 10 (FIG. 1) causes sensors 72 to flex in the same direction. When both sensors flex an equal amount in the same direction, they are 180° out of phase and the charges caused by acceleration are completely cancelled. If foam 16 is across the top 30e and bottom 30f, the foam will cause an increase in pressure on the sensor bending toward the other sensor while the foam across the other sensor will not. As an example, if acceleration causes pressure in a direction 90 (FIG. 14) from bottom 30f toward top 30e, foam extending across bottom 30f (not shown) will exert additional pressure on bottom sensor 72, while foam across top 30e (not shown) will not exert additional pressure on top sensor 72. As a result sensors 72 do not flex equally in the direction 90 and the acceleration of the transducer is not completely cancelled.

Referring to FIGS. 15 and 16, insulated electrical leads 26 and 28 are wrapped around housing assembly 12 and foam 16. Leads 26 and 28 are each shown wrapped around one end of housing assembly 12, but each lead 26, 28 may be wrapped around two opposite ends. Foam 16 prevents the leads from resting on the faces (i.e., 30e and 30f) of the sensor assemblies, and, thus, the leads do not reduce acceleration cancelling. Additionally, by wrapping the leads around assembly 12, the edges 92, 94 (FIG. 16) of the assembly provide strain relief. The strain relief dampens motion of the leads at the points 96 (FIGS. 14 and 16) where the leads extend from the seal material 88. Motion of the leads at point 96 may erroneously be detected by the sensors as acoustic sound energy. Foam 16 in the area of the strain relief further dampens lead motion. Furthermore, the strain relief prevents strain on leads 26 and 28, caused from towing the transducer 10 through water or some other medium, from pulling leads 26, 28 out of seal material 88 and away from sensors 72.

Figure 2:
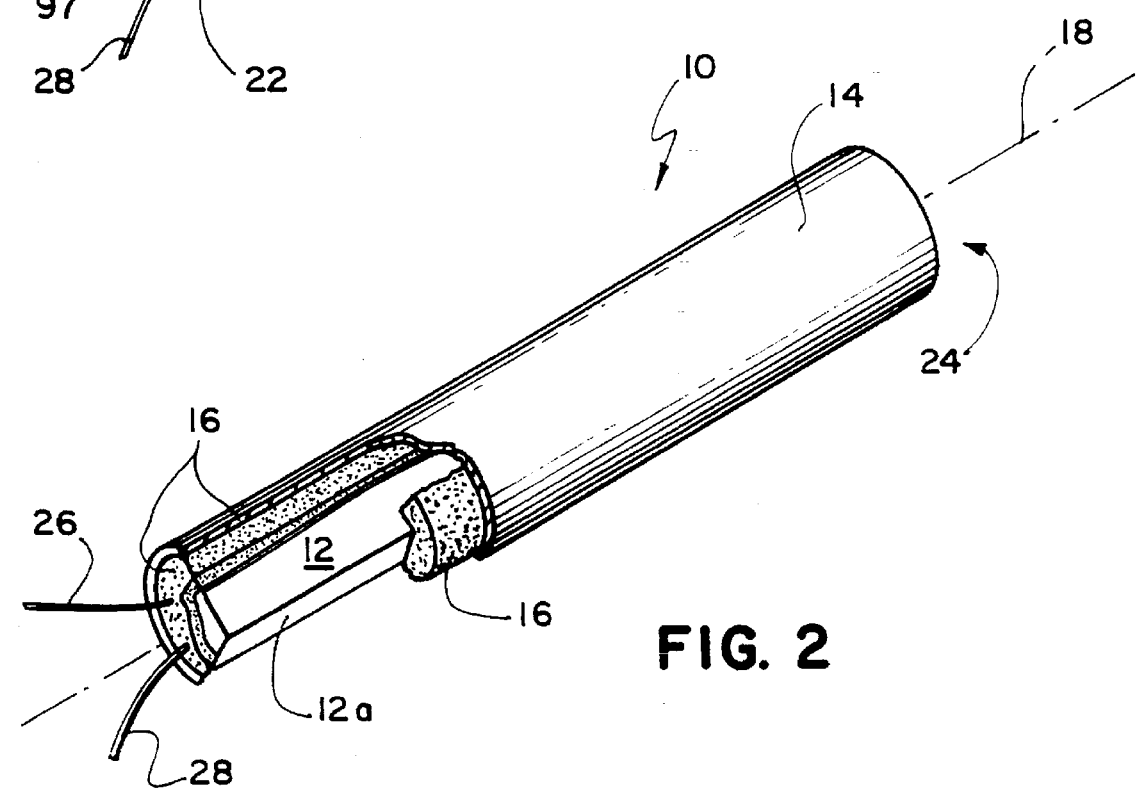
Figure 3:
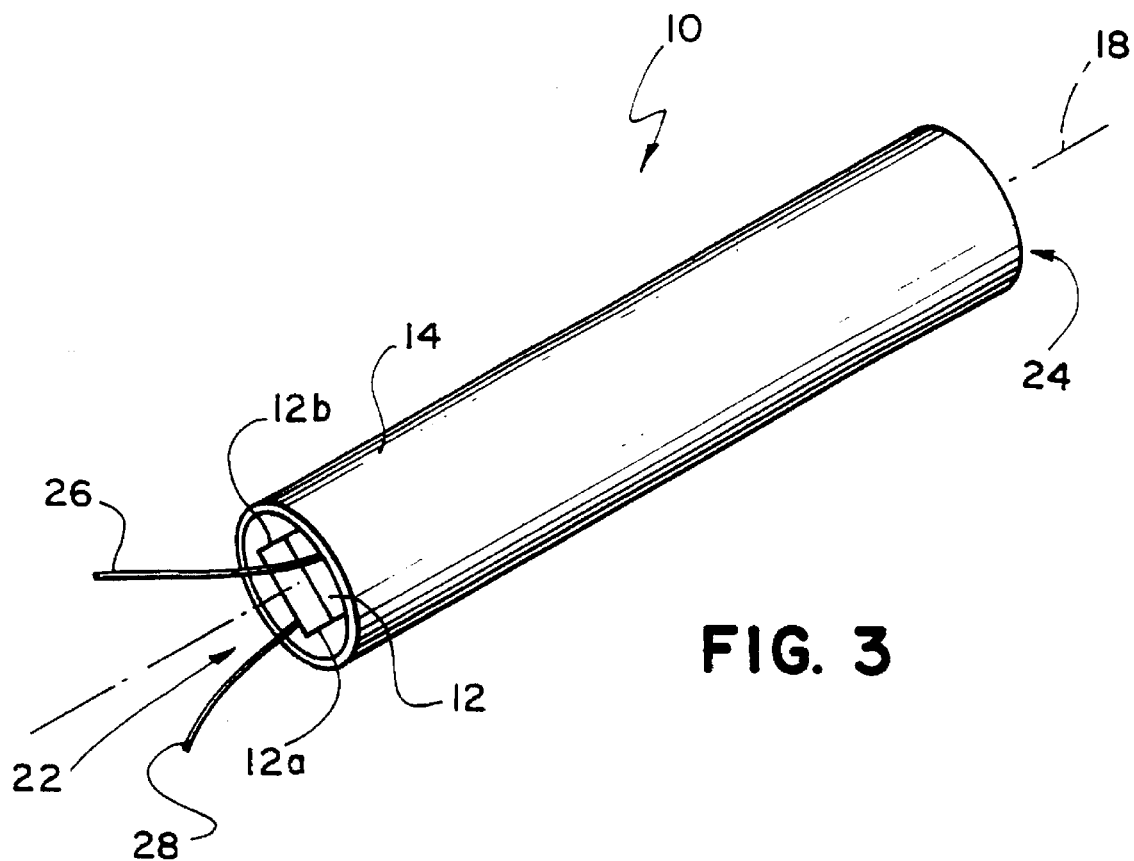
Figure 4:
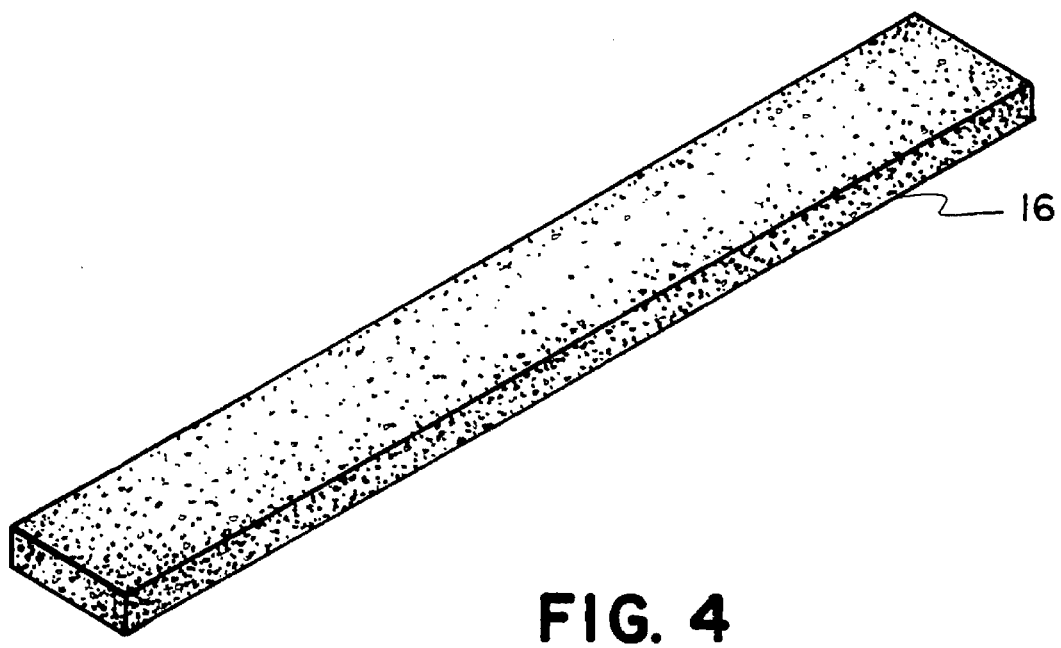
FIG. 4 is a perspective view of foam material.

Housing assembly 12 and foam 16 are then inserted into tube 14, as shown in FIG. 2. Foam 16 supports and centers housing assembly 12 along longitudinal axis 18 within tube 14. Tube 14 is about 1.8 inches long, about 0.54 inches in diameter, with a 0.050 inch thick wall, made of unpolarized polyvinylidene fluoride (PVDF), for example, Kynar made by AMP Incorporated or polyetherimide. The tube protects the housing assembly from bending forces created when the transducer is towed or stored, and may provide EMI and electrostatic shielding if made of a conductive material such as a metal, a carbon filed polymer, a metal filled polymer, or any composite material such as graphite or epoxy.

Figure 1:
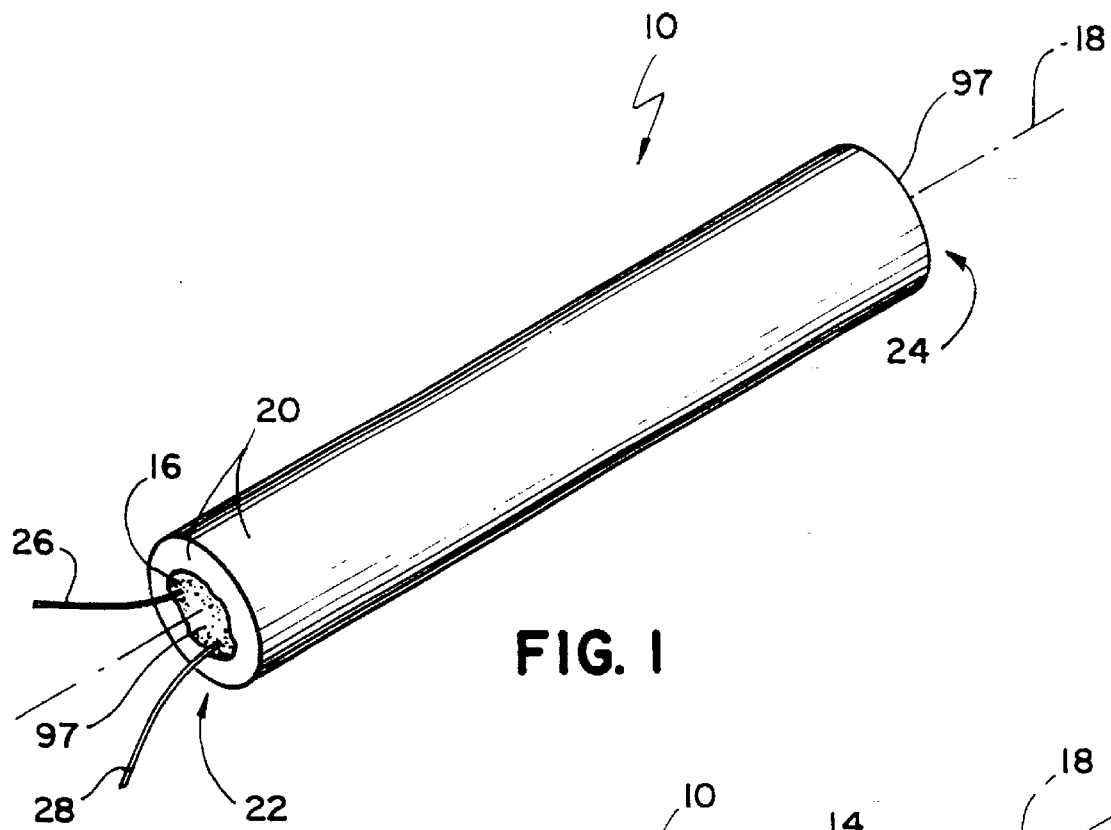

The assembly shown in FIG. 2 is then inserted in a sleeve of cover material 20 (FIG. 1). Cover material 20 may be a material which when exposed to heat shrinks (i.e., heat shrink material) or may be an elastic (i.e., compliant)

material that is stretched over tube 14. In either case, cover 20 wraps tightly around tube 14 and extends over ends 22, 24 of tube 14 to partially cover ends 22, 24 which retains foam 16 and housing assembly 12 within tube 14.

Cover 20 requires very little assembly time which may reduce the labor costs of manufacturing. Similarly, cover 20 is generally inexpensive which may reduce the materials costs of manufacturing. Additionally, the tight fit of cover 20 prevents movement of cover 20 which might erroneously be detected by sensors 72 as acoustic energy. Moreover, cover 20 provides a neat package that is aesthetically pleasing and that can be pre-printed with information (i.e., words, symbols, pictures). Pre-printing cover 20 may eliminate the need to design, order, and pay for stamps (containing the same information) and special inks and may reduce assembly time by eliminating the step required to apply a stamp to the transducer.

Cover 20 leaves a portion 97 (FIG. 1) of ends 22, 24 open to allow fluid to freely flow into tube 14. Among the typical fluids in which the transducer may be deployed are air, sea water, silicone (e.g., Dow Corning's dimethyl-, phenylmethyl-, or trifluoropropyl-silicone fluids) or any hydrocarbon solvent (e.g., Exxon Isopar solvent).

Foam 16 provides a wicking action which draws fluid into the inside of the tube and into contact with the sensor assemblies, expelling air from inside the tube and, thus, assuring that acoustic pressure vibrations in the fluid will be transmitted effectively to the sensor assemblies. At the same time, foam 16 provides mechanical noise filtering of unwanted vibrations of the fluid, i.e., flow noise, screening out the noise while allowing the acoustic pressure vibrations of interest to be coupled to the sensors.

The piezoelectric assembly of the transducer described above exhibits low harmonic distortion, high free field voltage sensitivity (for example, −194 dBV re 1uPa) and high capacitance (for example, 0.016 uF). Tube 14 protects the encapsulated piezoelectric assemblies from physical abuse and provides a hard surface for attachment in an array.

For national security reasons, the United States Government restricts certain foreign sales of transducers that operate below thirty-five meters (i.e., to prevent military surveillance). Referring to FIGS. 17, 18, 19a, and 19b, a conductive diaphragm 100 is placed on an electrically insulating adhesive ring 102 which holds a portion of the edge of diaphragm 100 to a surface of one of the sensors 72 while leaving a gap 104 between the center of diaphragm 100 and sensor 72. Electrical lead 28 from the other sensor 72 is electrically connected to diaphragm 100. The electrical connection can be made through a solder bond 106. Each basin 84, 86 is then filled with the polyurethane or epoxy seal 88 (FIG. 14).

The deeper the transducer is brought, the more pressure is exerted on the faces of the sensors 72 and, hence, on diaphragm 100 in a direction 108 (FIGS. 19a, 19b). At a depth of approximately 30–35 meters, diaphragm 100 collapses against sensor 72 (FIG. 19b) and, because of connection 106, causes the two sensors 72 to be electrically shorted together and completely cease to detect acoustic vibrations.

Electrically insulating adhesive ring 102 can be dispensed in the shape of a ring or purchased as a preform with adhesive on each side, similar to double-sided tape. A diaphragm 100 of beryllium copper, approximately 0.35 inches in diameter and about 0.006 inches thick, on a ring 102 approximately 0.002 inches thick will collapse against sensor 72 at about 30 meters.

Typically diaphragm 100 is plated with an inert metal, such as gold, to prevent corrosion of the diaphragm, for example, by the sealing material. This increases reliability. Additionally, just before ring 102 and diaphragm 100 are placed on sensor 72, sensor 72 can be abraded (i.e., cleaned) to provide a good contact between the diaphragm and the sensor. The sealing material prevents modification of the assembly.

Alternatively, two diaphragms 110, 112 can be separated by an electrically insulating adhesive ring 114 and electrically connected to both leads 26, 28, as shown in FIG. 20.

Referring to FIG. 21, in another transducer 210, a rectangular housing assembly 220 is held inside a tube 215 by a pin 211. Both ends 213, 214 of tube 215 are open allowing fluid to enter and become absorbed by foam pieces 212 which are wedged between the housing assembly 220 and tube 215. Electrical leads 216, 217 from the housing assembly extend through one open end 213 of the transducer 210 and can be connected to a charge amplifier, a voltage amplifier, a transformer coupled device, or any current sensing device (not shown).

Referring to FIGS. 22, 23, and 24, the housing assembly 220 includes a housing body 221 and four sensor assemblies 240, 241, 242, 243 mounted on the body. Housing body 221 is a generally rectangular piece molded of polyetherimide (containing about 30% glass), 2.5" long, 0.45" wide, and 0.250" thick, with chamfered edges. Body 221 has four radiused basins 226, 227, 228, 229, two on the top and two on the bottom. Each basin is 1.066 " long, 0.366" wide, and 0.090" deep. The floor of each basin has an inset radiused recess, 230, 231, 232, 233, which is 0.98" long, 0.28" wide, and 0.020" deep, leaving a rim 234, 235, 236, 237 on which corresponding sensor assemblies 240, 241, 242, 243 are seated and glued (e.g., by using silicone adhesive). The recesses 230, 231, 232, 233 provide clear space which permit the sensor assemblies to vibrate freely. Recesses 230, 231 are separated by a 0.030" thick web layer 238 of the housing body material which provides a degree of mechanical isolation between the sensor assemblies 240, 241, but also provides a degree of mechanical coupling between them to allow the sensor assemblies 240, 241 to collapse upon the web layer under pressure. A similar web layer 239 serves the same function between recesses 232, 233. Midway along its length, housing body 221 has a central portion 249 which includes a 0.136" diameter hole 281 (for receiving a mounting pin 211, as explained below), and two 0.063" diameter holes 222, 223 through which wires may be passed (for interconnecting the sensor assemblies as explained below).

Referring also to FIG. 25, each sensor assembly includes a 1.05" long, 0.35" wide, 0.010/0.012" thick radiused brass plate 244, 245, 246, 247. The plates may also be made from other metals, plastics, or composite materials. A 0.7" long, 0.3" wide, 0.009"±0.0015" thick piezoelectric sensor (made of PZT-5H ceramic and available from the Vernitron Division of Morgan Matroc Inc.) 250, 251, 252, 253 is mounted at the center of each of the plate. The sensors may also be made from any other films or layers that will produce a charge when stress is applied to them or that will produce a displacement when an electrical field is applied. Such layers may include polyvinylidene fluoride (PVDF), PVDF copolymers, quartz, or rubber ceramic composites. Each sensor is polarized with one face being deemed positive, the other negative. With its positive face exposed, each sensor is glued to its plate using speed bonder 325 and activator 707 available from Loctite. Each sensor assembly in turn is mounted in its basin (with the positive side of the sensor facing out) by gluing the periphery of the bottom of the plate to the corresponding rim using an adhesive, e.g., silicone. Other mounting methods, such as soldering or ultrasonic welding, may also be used. Then each basin is filled with a polyurethane or epoxy seal 298 (only one is shown in FIG. 22 for clarity). The seal protects and electrically insulates the sensor from dust, moisture, fluid, and hydrocarbon solvents.

Referring also to FIG. 26, housing assembly 220 is mounted within outer tube 215 which is 2.5"±0.2" long, 0.580"±0.2" in diameter, with a 0.065" thick wall, made of polyetherimide. A 0.125" diameter plastic pin 291 is inserted through holes 292, 293 (centered along the length of tube 215) and through hole 281 in the housing assembly. The ends of pin 211 are heat welded to the sides of housing 215. The tube protects the housing assembly from bending forces created when the transducer is towed or stored, and may provide EMI and electrostatic shielding if made of a conductive material such as a metal, a carbon filled polymer, a metal filled polymer, or any composite material such as graphite or epoxy. The housing assembly may alternatively be constructed out of any metal, thermoplastic or thermoset material, or composites thereof. Open cell soft foam pieces 212, 213 (made of polyether-based polyurethane) are wedged between the inner wall of tube 215 and the housing assembly with the foam making good contact with the four sensor assemblies and the foam exposed to fluid entering through the open ends of the tube.

The pin holds the housing assembly in place within the tube while allowing fluid to freely flow into the tube. Among the typical fluids in which the transducer may be deployed are air, sea water, silicone (e.g., Dow Corning's dimethyl-, phenylmethyl-, or trifluoropropyl-silicone fluids) or any hydrocarbon solvent (e.g., Exxon Isopar solvent). The foam pieces help to center and support the housing assembly within the tube. The foam pieces also provide a wicking action which draws fluid into the inside of the tube and into contact with the sensor assemblies, expelling air from inside the tube and thus assuring that acoustic pressure vibrations in the fluid will be transmitted effectively to the sensor assemblies. At the same time, the foam pieces provide a mechanical noise filtering effect of the unwanted vibrations of the fluid, i.e., flow noise, screening out the noise while allowing the acoustic pressure vibrations of interest to be coupled to the sensors.

Referring to FIG. 27, each sensor 240, 241, 242, 243 resembles a capacitor having a capacitance on the order of 0.016 µF. The pair of sensors 240, 241 on top of the housing assembly are wired in series, as are the sensors 242, 243 on the bottom of the housing assembly. The two pairs are wired in parallel. Wiring is done before the sensor assemblies are glued to the housing assembly.

Wiring the sensors in series pairs doubles the voltage sensitivity (i.e., increases it by 6 dB). The overall capacitance of the series/parallel connected set of sensors is also doubled, providing a high sensitivity and low electrical impedance output. Voltage sensitivity is relatively constant (approximately −194 dBV re 1 µPa) over a minimum frequency range of up to 1 kHz.

The voltage sensitivity of the sensors may be approximated by modeling each sensor as a supported beam having a length dimension equal to the width dimension of the sensor. Multiplying the calculated average stress on the sensor by its thickness and by its piezoelectric coefficient $g_{31}$ gives a first order approximation of the sensor's voltage sensitivity. (The coefficient $g_{31}$ represents, for any given material, the magnitude of the electric field generated as a result of an applied stress to the material or the strain developed as a result of an applied electrical field).

By mounting the sensors 240, 241 and 242, 243 back-to-back and with their positive faces out, spurious mechanical accelerations and vibrations are cancelled when the displacements of the paired sensors are out of phase. The spurious acceleration induced charges are completely cancelled when the paired sensors are 180° out of phase.

Other embodiments are within the scope of the following claims. For example, other techniques could be used for mounting the housing assembly in the tube, e.g., by snap fit adhesives, welding, or friction fit. Additionally, higher operating frequencies are obtainable by scaling down the dimensions of the transducer, thereby increasing the natural resonant frequency of the sensor assemblies. Further, the paired sensor assemblies may be mounted with the positive faces of the sensors facing the same direction. Spurious acceleration cancelling is accomplished then by mounting the positive faces of the sensors in an adjacent second pair of sensor assemblies in the opposite direction from the first pair.

What is claimed is:

1. A transducer comprising
    an elongated chamber having at least one open end to allow fluid to flow into the chamber,
    a piezoelectric sensor mounted inside the chamber, the sensor having faces defined by edges, and
    wicking material inside the chamber between the sensor and the chamber, for wicking fluid into the chamber.

2. The transducer of claim 1, wherein at least a substantial portion of one of the faces of the sensor is unobstructed by the wicking material.

3. The transducer of claim 1, wherein the wicking material comprises a foam wrapped around the edges of the sensor.

4. The transducer of claim 1, wherein the wicking material provides filtering of noise from vibrations occurring in the fluid.

5. The transducer of claim 1 further comprising
    a flexible cover material, positioned around the chamber and over a portion of the open end, to hold the sensor within the chamber.

6. The transducer of claim 5, wherein the cover material comprises heat shrink material.

7. The transducer of claim 5, wherein the cover material comprises an elastic sleeve.

8. The transducer of claim 1 wherein the elongated chamber comprises a tube.

9. The transducer of claim 1 further comprising
    a mounting mechanism for holding the piezoelectric sensor in the elongated chamber without obstructing passage of fluid into the elongated chamber.

10. The transducer of claim 1 wherein said wicking material comprises a fluid permeable material.

11. The transducer of claim 1 further comprising
    a mechanism for securing the sensor within the chamber without applying pressure between an inner wall of the chamber and the sensor.

12. The transducer of claim 11, wherein the securing mechanism comprises a sleeve that extends over a first portion of the at least one open end of the chamber, leaving a second portion of the at least one open end of the chamber open to allow the passage of fluid into the chamber.

13. The transducer of claim 1 or 11, wherein the sensor is mounted with said faces parallel to a longitudinal axis of the chamber.

14. The transducer of claim 1 or 11, wherein the chamber comprises a tube open at both ends.

15. A transducer comprising a piezoelectric sensor, an elongated chamber having at least one open end to allow the passage of fluid into the chamber, and a mechanism for securing the sensor within the chamber without applying pressure between an inner wall of the chamber and the sensor, wherein the securing mechanism is a sleeve that extends over a first portion of the at least one open end of the chamber, leaving a second portion of the at least one open end of the chamber open to allow the passage of fluid into the chamber.

16. The transducer of claim 15, wherein said securing mechanism comprises heat shrink material.

17. The transducer of claim 15, wherein said securing mechanism comprises an elastic sleeve.

* * * * *